United States Patent
Takagi et al.

(10) Patent No.: US 9,236,124 B2
(45) Date of Patent: Jan. 12, 2016

(54) NONVOLATILE MEMORY DEVICE

(71) Applicant: Kabushiki Kaisha Toshiba, Minato-ku (JP)

(72) Inventors: Takeshi Takagi, Yokkaichi (JP); Takeshi Yamaguchi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/453,987

(22) Filed: Aug. 7, 2014

(65) Prior Publication Data

US 2015/0255715 A1    Sep. 10, 2015

Related U.S. Application Data

(60) Provisional application No. 61/949,478, filed on Mar. 7, 2014.

(51) Int. Cl.
*G11C 13/00* (2006.01)
*H01L 45/00* (2006.01)
*H01L 27/24* (2006.01)

(52) U.S. Cl.
CPC ........ *G11C 13/0097* (2013.01); *G11C 13/0011* (2013.01); *H01L 27/249* (2013.01); *H01L 27/2463* (2013.01); *H01L 45/146* (2013.01)

(58) Field of Classification Search
CPC ........... G11C 13/0011; G11C 13/0097; H01L 27/24; H01L 27/2469; H01L 27/2481; H01L 27/249; H01L 45/146
USPC ........................................................ 365/148
See application file for complete search history.

(56) References Cited

U.S. PATENT DOCUMENTS

| | | | |
|---|---|---|---|
| 8,319,291 B2 | 11/2012 | Kim et al. | |
| 8,441,839 B2 * | 5/2013 | Azuma | G11C 13/0007 365/148 |
| 8,488,374 B2 | 7/2013 | Liu | |
| 8,779,406 B2 * | 7/2014 | Ito | H01L 45/145 257/2 |
| 9,006,793 B2 * | 4/2015 | Wei | H01L 27/2409 257/204 |
| 2012/0211722 A1 | 8/2012 | Kellam et al. | |
| 2012/0319072 A1 | 12/2012 | Wei et al. | |
| 2013/0134377 A1 | 5/2013 | Park et al. | |

FOREIGN PATENT DOCUMENTS

| | | |
|---|---|---|
| JP | 2013-510438 | 3/2013 |
| JP | 2013-115436 | 6/2013 |
| JP | 2013-531887 | 8/2013 |
| WO | 2011/105060 A1 | 9/2011 |

* cited by examiner

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

According to one embodiment, a plurality of first wirings is disposed in first and second directions crossing each other and extends in a third direction perpendicular to the first and second directions. Second wirings extend in the second direction and are provided at a predetermined interval in the third direction of the first wirings. The first wiring includes a metal plug layer and a barrier metal film. A standard electrode potential of a metal that forms the barrier metal film is higher than a standard electrode potential of a metal that forms the variable resistive layer.

15 Claims, 8 Drawing Sheets

FIG.6

| METAL | STANDARD ELECTRODE POTENTIAL |
|---|---|
| Al | -1.68 |
| Ti | -1.63 |
| Hf | -1.55 |
| Zr | -1.45 |
| Nb | -1.1 |
| Ta | -0.6 |
| Co | -0.28 |
| Ni | -0.26 |
| W | 0.1 |
| Cu | 0.34 |
| Ru | 0.68 |
| Ir | 1.16 |
| Pt | 1.19 |
| Au | 1.52 |

NONVOLATILE MEMORY DEVICE

CROSS-REFERENCE TO RELATED APPLICATIONS

This application is based upon and claims the benefit of priority from U.S. Provisional Application No. 61/949,478, filed on Mar. 7, 2014; the entire contents of which are incorporated herein by reference.

FIELD

Embodiments described herein relate generally to a nonvolatile memory device.

BACKGROUND

A resistive random access memory (hereinafter, referred to as a ReRAM) using for a memory element a variable resistive layer capable of retaining a plurality of resistance states is known. In the related art there has been proposed a ReRAM having a three-dimensional structure in which a plurality of nR-1Tr type strings are disposed above a substrate and in the plurality of nR-1Tr type strings, a plurality of word lines is disposed in a height direction through variable resistive layers on side surfaces of bit lines disposed perpendicular to the substrate and including selection transistors at end portions thereof close to the substrate.

Since a current flows in the ReRAM during a set operation and a reset operation, the word lines and the bit lines are required to have low resistance. In the ReRAM having a three-dimensional structure, there is a case in which the bit lines disposed perpendicular to the substrate are made of polysilicon. In this case, the resistance of polysilicon often has been made low by activation annealing.

On the other hand, there is a case in which an oxygen profile (or an oxygen-deficiency profile) of the variable resistive layers are controlled for the stabilization of the operation of the ReRAM. However, when the activation annealing processing for polysilicon forming the bit lines is performed, the oxygen profile may collapse, it may be difficult to perform accurate control, and the operation of the ReRAM may become unstable.

BRIEF DESCRIPTION OF THE DRAWINGS

FIG. 6 is a diagram illustrating an example of standard electrode potentials of metal elements;

DETAILED DESCRIPTION

According to an embodiment, a nonvolatile memory device includes a plurality of first wirings, a plurality of second wirings, and nonvolatile memory cells. The plurality of first wirings is disposed in first and second directions crossing each other and extends in a third direction perpendicular to the first and second directions. The plurality of second wirings extends in the second direction and is provided at a predetermined interval in the third direction of the first wirings. The memory cells are disposed at positions where the first and second wirings cross each other, so as to be interposed between the first and second wirings. The memory cell includes a variable resistive layer of which a resistance state changes according to an electrical signal to be applied. The first wiring includes a metal plug layer and a barrier metal film that is provided between the metal plug layer and the variable resistive layer. A standard electrode potential of a metal that forms the barrier metal film is higher than a standard electrode potential of a metal that forms the variable resistive layer.

Nonvolatile memory devices according to embodiments will be described below in detail with reference to the accompanying drawings. Meanwhile, the present invention is not limited by these embodiments. A cross-sectional view, a top view and a perspective view of a nonvolatile memory device used in the embodiments below are schematic views, and a relationship between the thickness and the width of a layer, a ratio of the thickness of each layer, and the like may be different from the actual one.

First Embodiment

Figure 1:
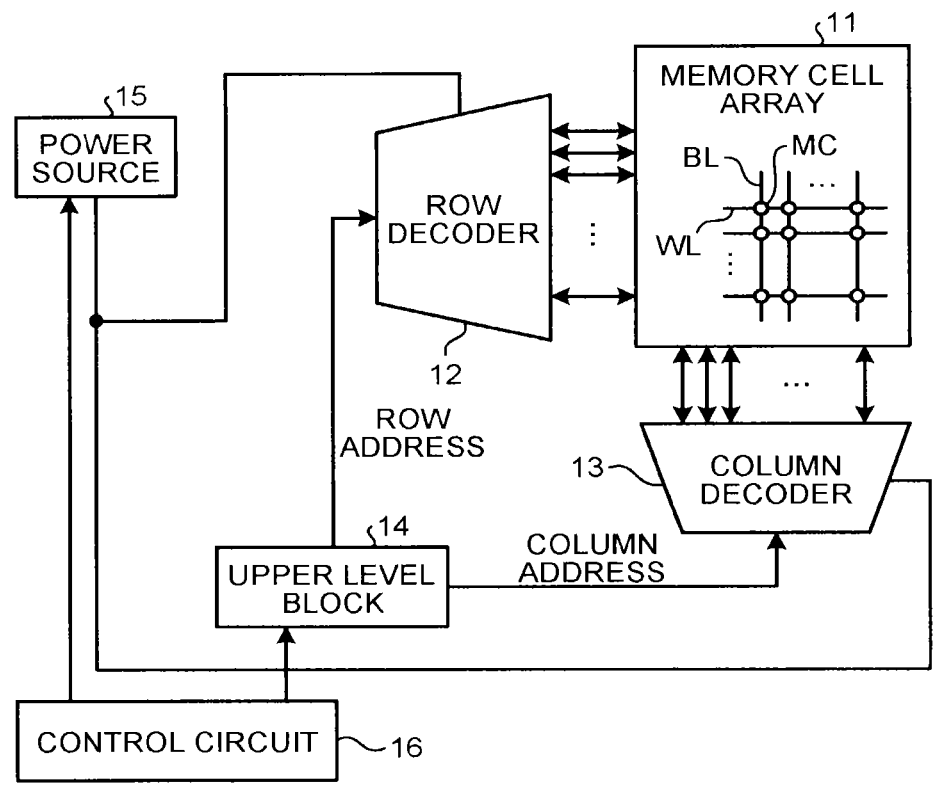
FIG. 1 is a diagram illustrating an example of a main part of a nonvolatile memory device according to a first embodiment.

FIG. 1 is a diagram illustrating an example of a main part of a nonvolatile memory device according to a first embodiment. The nonvolatile memory device includes a memory cell array 11, a row decoder 12, a column decoder 13, an upper level block 14, a power source 15, and a control circuit 16.

The memory cell array 11 includes a plurality of word lines WL and a plurality of bit lines BL crossing each other and memory cells MC that are disposed respectively at portions where the word lines WL and the bit lines BL cross each other. The row decoder 12 selects a word line WL during access (the erasing, writing, and reading of data). The column decoder 13 selects a bit line BL during access, and includes a driver that controls an access operation.

The upper level block 14 selects a memory cell MC to be accessed in the memory cell array 11. The upper level block 14 gives a row address and a column address to the row decoder 12 and the column decoder 13. The power source 15 generates a combination of predetermined voltages corresponding to an operation for erasing data, an operation for writing data, and an operation for reading data, and supplies the combination to the row decoder 12 and the column decoder 13. The control circuit 16 performs control such as sending an address to the upper level block 14 according to a command from the outside, and also controls the power source 15.

Figure 2:
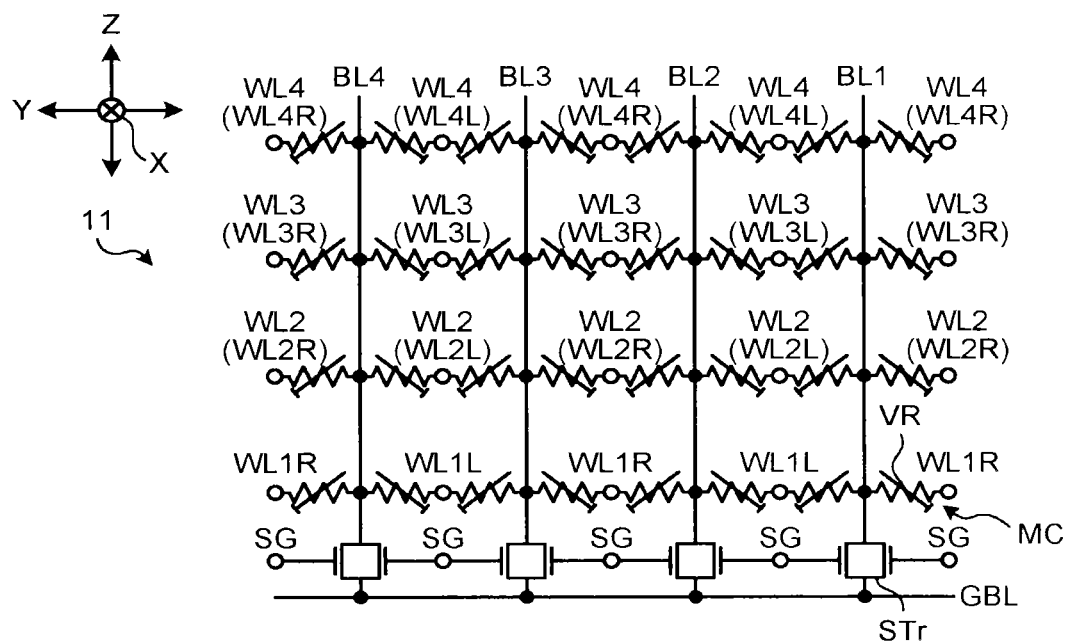
FIG. 2 is a diagram illustrating an example of a circuit diagram of a memory cell array.
Figure 3:
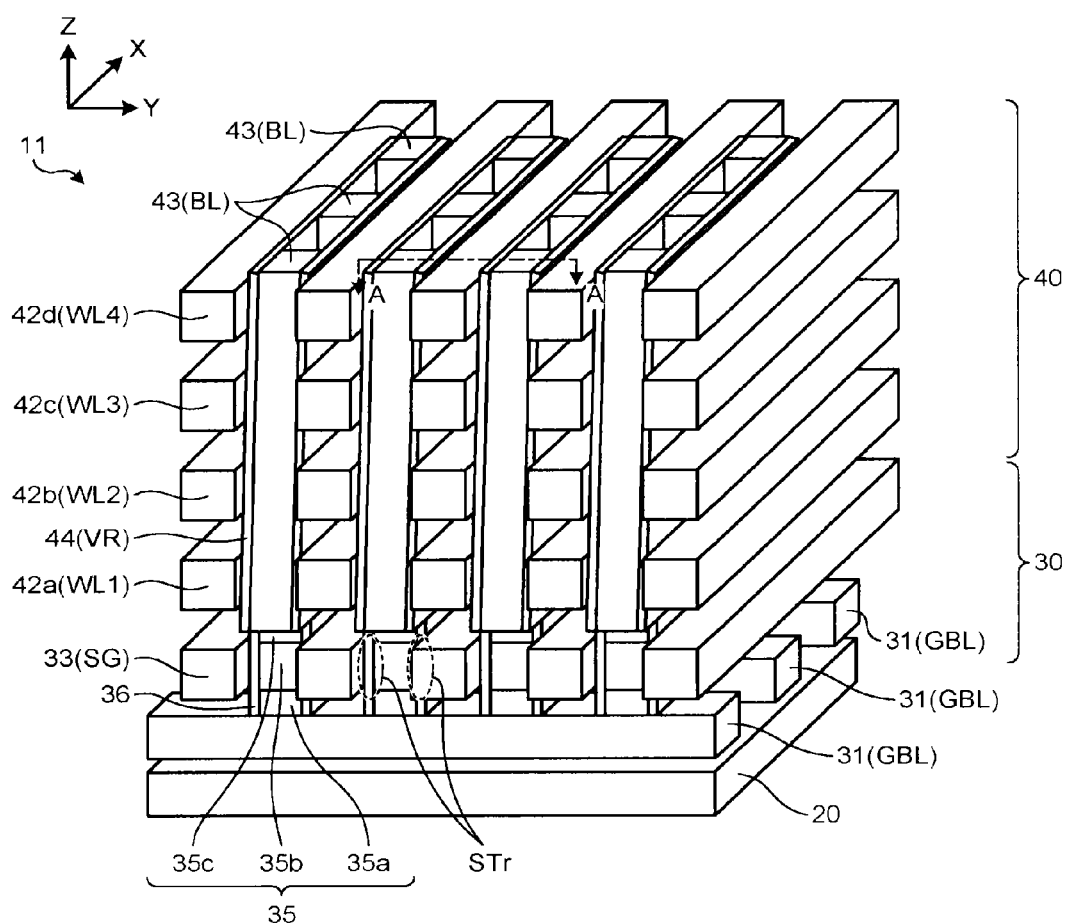
FIG. 3 is a perspective view illustrating an example of a stacked structure of the memory cell array.

FIG. 2 is a diagram illustrating an example of a circuit diagram of the memory cell array, and FIG. 3 is a perspective view illustrating an example of a stacked structure of the memory cell array. Meanwhile, an X direction, a Y direction, and a Z direction are perpendicular to each other in FIG. 2, and the X direction is a direction perpendicular to the plane of FIG. 2. Further, the structure illustrated in FIG. 2 is repeatedly provided in the X direction.

As illustrated in FIG. 2, the memory cell array 11 includes selection transistors STr, global bit lines GBL, and selection gate lines SG, in addition to the word lines WL, the bit lines BL, and the memory cells MC that are described above.

As illustrated in FIGS. 2 and 3, the word lines WL1 to WL4 are arranged at a predetermined pitch in the Z direction and extend in the X direction. The bit lines BL are arranged in the form of a matrix in the X direction and the Y direction, and extend in the Z direction. The memory cells MC are disposed at locations where the word lines WL and the bit lines BL cross each other. Accordingly, the memory cells MC are arranged in the form of a three-dimensional matrix in the X direction, the Y direction, and the Z direction. As illustrated in FIG. 2, the memory cells MC include variable resistive elements VR.

As illustrated in FIG. 2, the selection transistors STr are provided between one end of each of the bit lines BL and the global bit lines GBL. The global bit lines GBL are arranged side by side at a predetermined pitch in the X direction, and extend in the Y direction. One global bit line GBL is connected in common to one end of each of the plurality of selection transistors STr that is arranged in line in the Y direction.

Further, gate electrodes of two selection transistors STr, which are arranged adjacent to each other in the Y direction, can be connected in common to each other. The selection gate lines SG are arranged side by side at a predetermined pitch in the Y direction, and extend in the X direction. One selection gate line SG is connected in common to the gate electrodes of the plurality of selection transistors STr that is arranged in line in the X direction. Meanwhile, it is also possible to independently operate two selection transistors STr by separating the gate electrodes of the two selection transistors STr, which are arranged adjacent to each other in the Y direction, from each other.

Figure 4:
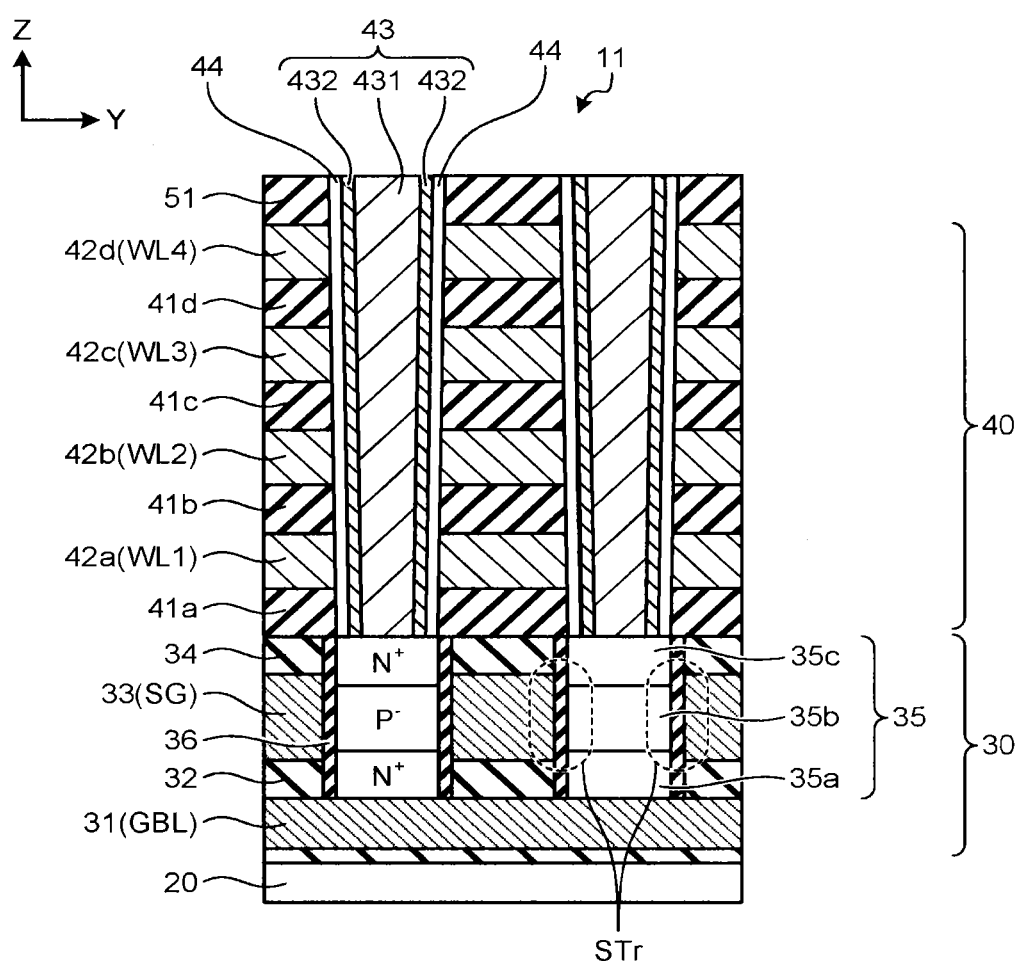
FIG. 4 is an example of a cross-sectional view taken along line A-A of FIG. 3.
Figure 5:
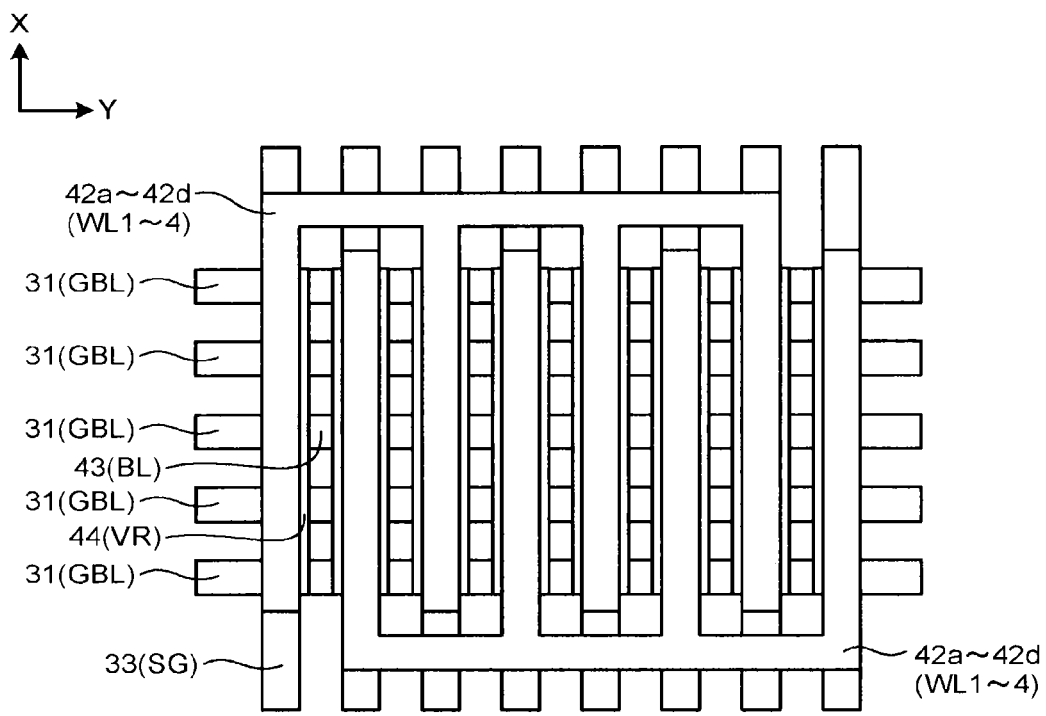
FIG. 5 is an example of a top view of FIG. 3.

Next, the stacked structure of the memory cell array 11 according to the first embodiment will be described. FIG. 4 is an example of a cross-sectional view taken along line A-A of FIG. 3, and FIG. 5 is an example of a top view of FIG. 3. Meanwhile, an interlayer insulating film is not illustrated in FIGS. 3 and 5.

As illustrated in FIGS. 3 and 4, the memory cell array 11 includes a selection transistor layer 30 and a memory layer 40 that are stacked above a substrate 20. The selection transistor layer 30 functions as the selection transistor STr, and the memory layer 40 functions as the memory cell MC.

As illustrated in FIGS. 3 and 4, the selection transistor layer 30 includes conductive layers 31, interlayer insulating films 32, conductive layers 33, and interlayer insulating films 34. The conductive layers 31, the interlayer insulating films 32, the conductive layers 33, and the interlayer insulating films 34 are stacked in the Z direction that is perpendicular to the substrate 20. The conductive layers 31 function as the global bit lines GBL, and the conductive layers 33 function as the selection gate lines SG and the gates of the selection transistors STr.

The conductive layers 31 have the shape of stripes that are arranged side by side at a predetermined pitch in the X direction parallel to the substrate 20 and extend in the Y direction (see FIG. 5). Although not illustrated in FIG. 3, interlayer insulating films are formed between the plurality of conductive layers 31.

The interlayer insulating films 32 are formed so as to cover upper surfaces of the conductive layers 31, and function to electrically insulate the conductive layers 31 from the selection gate lines SG (conductive layers 33). The conductive layers 33 are formed in the shape of stripes that are arranged side by side at a predetermined pitch in the Y direction and extend in the X direction (see FIG. 5). The interlayer insulating films 34 are deposited so as to cover side surfaces and upper surfaces of the conductive layers 33. For example, the conductive layers 31 and 33 are made of polysilicon. The interlayer insulating films 32 and 34 are made of a silicon oxide ($SiO_2$).

Further, the selection transistor layer 30 includes, for example, pillar-shaped semiconductor layers 35 and gate insulating layers 36 as illustrated in FIGS. 3 and 4. The semiconductor layers 35 function as bodies (channels) of the selection transistors STr, and the gate insulating layers 36 function as gate insulating films of the selection transistors STr. Meanwhile, in the first embodiment, the selection transistor layer 30 includes an N-channel field effect transistor.

The semiconductor layers 35 are disposed in the shape of a matrix in the X direction and the Y direction, and extend in the Z direction. Furthermore, the semiconductor layers 35 come into contact with the upper surfaces of the conductive layers 31, and come into contact with the side surfaces of the conductive layers 33 in the Y direction through the gate insulating layers 36. Moreover, the semiconductor layer 35 includes an N+ type semiconductor layer 35a, a P− type semiconductor layer 35b, and an N+ type semiconductor layer 35c that are stacked from the lower side toward the upper side in the Z direction.

As illustrated in FIGS. 3 and 4, side surfaces of the N+ type semiconductor layers 35a in the Y direction come into contact with the interlayer insulating films 32 through the gate insulating layers 36. Side surfaces of the P− type semiconductor layers 35b in the Y direction come into contact with the side surfaces of the conductive layers 33 through the gate insulating layers 36. Side surfaces of the N+ type semiconductor layers 35c in the Y direction come into contact with the interlayer insulating films 34 through the gate insulating layers 36. The N+ type semiconductor layers 35a and 35c are made of polysilicon into which an N+ type dopant is implanted, and the P− type semiconductor layer 35b is made of polysilicon into which a P+ type dopant is implanted. The gate insulating layer 36 is made of, for example, a silicon oxide ($SiO_2$). Meanwhile, a barrier metal layer may be formed between the semiconductor layer 35 and a conductive layer 43 to be described below and between the semiconductor layer 35 and the conductive layer 31 (the barrier metal layer is not illustrated in FIG. 4).

As illustrated in FIGS. 3 and 4, the memory layer 40 includes interlayer insulating films 41a to 41d and 51 and conductive layers 42a to 42d that are alternately stacked in the Z direction. The conductive layers 42a to 42d function as the word lines WL1 to WL4, respectively. The respective conductive layers 42a to 42d have the shape of a pair of comb teeth, which face each other in the X direction, when viewed in the Z direction (see FIG. 5). That is, word lines WLiR (i=1 to 4), which belong to one of the conductive layers having the shape of a pair of comb teeth, and word lines WLiL, which belong to the other thereof, are alternately formed in the Y direction (see FIG. 2). It is possible to reduce the number of contacts, which are connected to the word lines WL, by employing the conductive layers that have the shape of comb teeth. Meanwhile, the interlayer insulating films 41a to 41d and 51 are made of, for example, a silicon oxide ($SiO_2$), and the conductive layers 42a to 42d are made of, for example, a conductive semiconductor material, such as W, Ti, WN, TiN, or p type or n type polysilicon.

Further, as illustrated in FIGS. 3 and 4, the memory layer 40 includes, for example, pillar-shaped conductive layers 43 and variable resistive element forming layers 44. The variable resistive element forming layers 44 are provided so as to be shared on both side surfaces in the Y direction of the plurality of pillar-shaped conductive layers 43, which are arranged in the X direction.

The conductive layers 43 function as the bit lines BL. In this embodiment, the conductive layer 43 includes a metal plug 431 and barrier metal films 432 that are provided between the metal plug 431 and the variable resistive element forming layers 44. The barrier metal film 432 is provided to prevent a metal material, which forms the metal plug 431, from being diffused toward the variable resistive element forming layer 44 or to suppress interaction therebetween, and to improve the adhesion between the metal plug 431 and the variable resistive element forming layer 44. It is preferable that the film thickness of the barrier metal film 432 allows adhesion to be improved between the metal plug 431 and the variable resistive element forming layer 44 and do not allow the metal element forming the metal plug 431 to be diffused toward the variable resistive element forming layer 44. It is preferable that the film thickness of the barrier metal film 432 be for example, 2 nm or more and 7 nm or less. When the conductive layer 43 includes the metal plug 431 and the barrier metal films 432 as described above, the conductive layer 43 can be produced at a low temperature as compared to a conductive layer made of polysilicon and can have a low resistance as compared to a conductive layer made of polysilicon.

The variable resistive element forming layers 44 function as the variable resistive elements VR in the area that is interposed between the conductive layers 43 and the conductive layers 42a to 42d. When a voltage having a first polarity and an absolute value larger than the absolute value of a first threshold voltage having the first polarity is applied to the variable resistive element forming layer 44, the resistance state of the variable resistive element forming layer 44 is switched to a low-resistance state. When a voltage having a second polarity and an absolute value larger than the absolute value of a second threshold voltage having the second polarity opposite to the first polarity is applied to the variable resistive element forming layer 44 in this state, the resistance state of the variable resistive element forming layer 44 is switched to a high-resistance state. Further, when a voltage between the first and second threshold voltages is applied, the low-resistance state or the high-resistance state is maintained without the change of a resistance value. As described above, the variable resistive element forming layer 44 is made of a material that performs a so-called bipolar type operation. Meanwhile, in the first embodiment, a filament is generated between the conductive layers 42a to 42d, which function as the word lines WL, and the conductive layer 43, which functions as a local bit line, by forming operation and a switch area in which a resistance changing operation (switch operation) is performed is formed near an interface (first variable resistive layer 441) of the filament, which is close to the local bit line (conductive layer 43). A metal oxide, which contains at least one element of, for example, Al, Ti, Hf, Zr, Nb, and Ta, is used as this variable resistive material.

In this embodiment, a metal is used for the conductive layer 43 and a metal oxide is used for the variable resistive element forming layer 44. Further, a plurality of resistance states can be achieved in the variable resistive element forming layer 44 by an oxidation-reduction reaction that occurs in the switch area in which a resistance changing operation (switch operation) in the filament is performed. In this case, when a voltage is applied between the conductive layer 43 and the conductive layers 42a to 42d, the movement of oxygen occurs in the switch area. Accordingly, it is considered that the resistance state in the switch area changes due to the movement of oxygen. For this reason, for example, when a positive voltage with respect to the conductive layers 42a to 42d is applied to the conductive layer 43, oxygen ions $O^{2-}$ are attracted to the conductive layer 43 in the switch area. At this time, if the conductive layer 43 is made of a metal that is easily oxidized, the conductive layer 43 is oxidized when used. Accordingly, there is a possibility that the conductive layer cannot stably operate as an electrode of an element.

For this reason, in this embodiment, metal elements, which form the barrier metal film 432 and the variable resistive element forming layer 44, are selected so that a standard electrode potential of a metal that forms the barrier metal film 432 coming into contact with the variable resistive element forming layer 44 is higher than a standard electrode potential of a metal that forms the variable resistive element forming layer 44. The standard electrode potential represents the ease of the oxidation of the element, and is also called an oxidation-reduction potential. As the value of the standard electrode potential is higher, oxidation does not easily occur. As the value of the standard electrode potential is lower, oxidation easily occurs.

FIG. 6 is a diagram illustrating an example of standard electrode potentials of metal elements. As illustrated in FIG. 6, for example, a standard electrode potential of Al is −1.68 eV. When the variable resistive element forming layer 44 is made of an oxide of Al, a metal having a standard electrode potential higher than the standard electrode potential of Al or a nitride of the metal may be used as the barrier metal film 432. In the example of FIG. 6, metals having a standard electrode potential higher than the standard electrode potential of Al are Ti, Hf, Zr, Nb, Ta, Co, Ni, W, Cu, Ru, Ir, Pt, Au, and the like. For this reason, oxides of these metals can be used as the variable resistive element forming layer 44. Meanwhile, when the variable resistive element forming layer 44 is made of a metal oxide containing at least one element of Ti, Hf, Zr, Nb, and Ta, a metal that can be used as the barrier metal film 432 is determined likewise. When TaN, WN, Co, or Ru among them is particularly used as the barrier metal film 432, it is possible to improve the adhesion between the variable resistive element forming layer 44 and the metal forming the metal plug 431 and to prevent the diffusion or interaction of the metal element forming the metal plug 431.

Meanwhile, when the metal plug 431 is made of W and the barrier metal film 432 is made of WN in the conductive layer 43, when the metal plug 431 is made of Cu and the barrier metal film 432 is made of Ru, or when the metal plug 431 is made of Cu and the barrier metal film 432 is made of TaN, particularly, it is possible to make the resistance of the conductive layer 43 low and to allow the conductive layer 43 to stably operate.

The conductive layers 43 are disposed in the form of a matrix in the X direction and the Y direction. The lower ends of the conductive layers 43 come into contact with the upper surfaces of the semiconductor layers 35, and the conductive layers 43 extend in the form of a pillar in the Z direction. Although not illustrated in FIG. 3, interlayer insulating films are formed between the conductive layers 43 that are arranged side by side in the X direction.

The variable resistive element forming layers 44 are provided between the side surfaces in the Y direction of the conductive layer 43 and the side surfaces in the Y direction of the interlayer insulating films 41a to 41d. Further, the variable resistive element forming layers 44 are provided between the side surfaces in the Y direction of the conductive layers 43 and the side surfaces in the Y direction of the conductive layers 42a to 42d.

Figure 7A:
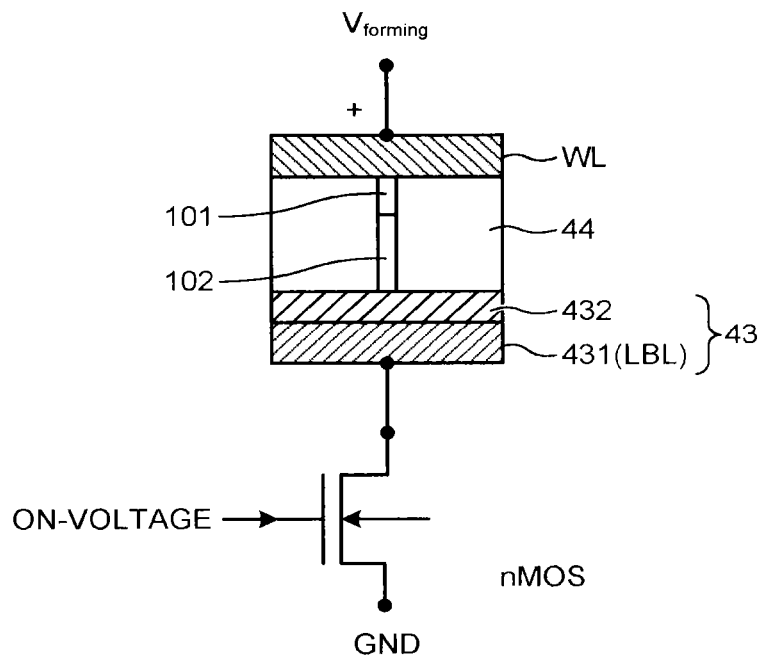
FIGS. 7A to 7C are diagrams illustrating the outline of operations of the nonvolatile memory device according to the first embodiment.
Figure 7B:
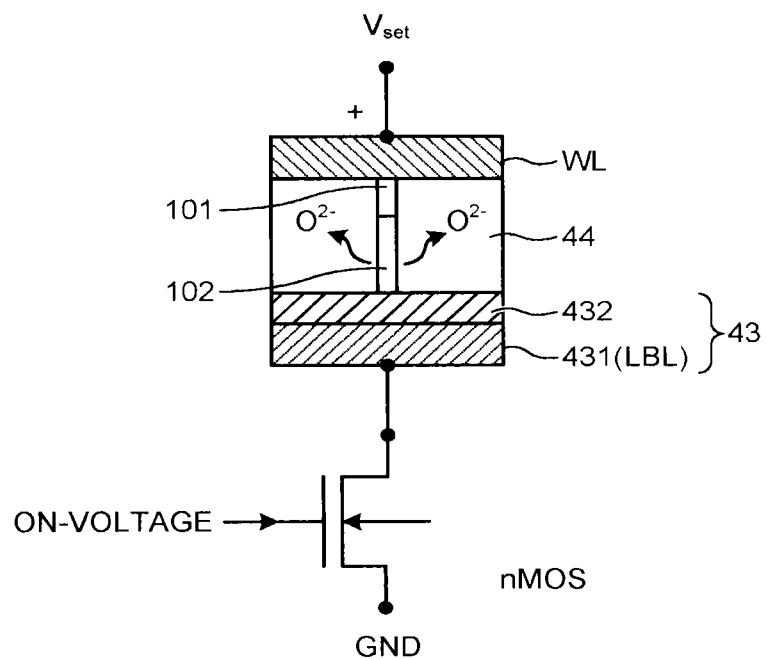
Figure 7C:
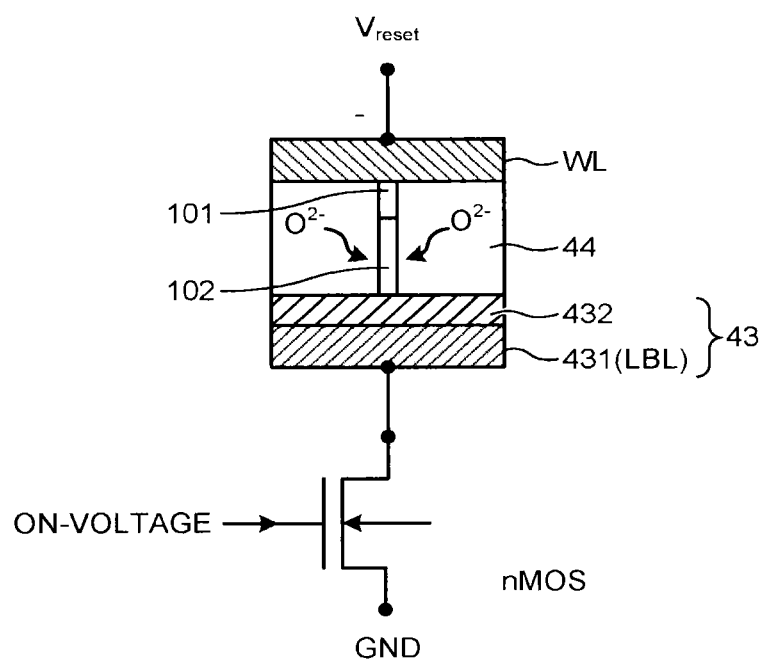

Next, a forming operation, a set operation, a reset operation, and a read operation in the nonvolatile memory device having this structure will be described briefly. FIGS. 7A to 7C are diagrams illustrating the outline of operations of the nonvolatile memory device according to the first embodiment.

The variable resistive element forming layer 44, which forms the memory cell MC of the nonvolatile memory device immediately after the nonvolatile memory device is produced, is in a state of an insulator, that is, a high-resistance state. Accordingly, a forming operation for forming a filament 101 in the variable resistive element forming layer 44 is performed. As illustrated in FIG. 7A, in the forming operation, a bit line BL to which a selected memory cell MC is connected is caused to have, for example, a ground potential GNU, and a positive forming voltage Vforming with respect to the bit line BL is applied to a word line WL to which the selected memory cell MC is connected. Meanwhile, for example, Vforming/2 is applied to unselected word lines WL. Further, an ON-voltage is applied to an N channel type selection transistor of a local bit line LBL to which the selected memory cell MC is connected so that the selection transistor is caused to be in a conductive state. Accordingly, the filament 101 is formed in the variable resistive element forming layer 44. Furthermore, a switch area 102 in which resistance is mainly changed is formed at a portion of the variable resistive element forming layer 44 close to the local bit line LBL (barrier metal film 432). As a result, the variable resistive element forming layer 44 becomes in a low-resistance state. After that, a reset operation for changing the memory cell MC from a low-resistance state to a high-resistance state or a set operation for changing the memory cell MC from a high-resistance state to a low-resistance state is performed.

As shown in FIG. 7B, when a set operation for changing a certain selected memory cell MC from a high-resistance state to a low-resistance state is performed, a bit line BL to which the selected memory cell MC is connected is caused to have, for example, a ground potential GND and a positive set voltage Vset with respect to the bit line BL is applied to a word line WL to which the selected memory cell MC is connected. Meanwhile, for example, Vset/2 is applied to unselected word lines WL. Further, an ON-voltage is applied to an N channel type selection transistor of the local bit line LBL to which the selected memory cell MC is connected so that the selection transistor is caused to be in a conductive state. Accordingly, oxygen ions $O^{2-}$ are pushed from the switch area 102 of the selected memory cell MC toward the word lines WL, so that a reduction reaction occurs in the switch area 102 of the filament 101. As a result, it is considered that the resistance state of the variable resistive element forming layer 44 transfers to a low-resistance state due to the reduction of the resistivity of the switch area 102.

As illustrated in FIG. 7C, when a reset operation for changing a certain selected memory cell MC from a low-resistance state to a high-resistance state is performed, a bit line BL to which the selected memory cell MC is connected is caused to have, for example, a ground potential GND and a negative reset voltage Vreset with respect to the bit line BL is applied to a word line WL to which the selected memory cell MC is connected. Meanwhile, a voltage Vreset/2, which is a half of the reset voltage Vreset, is applied to the other unselected word lines WL. Further, an ON-voltage is applied to an N channel type selection transistor of the local bit line LBL to which the selected memory cell MC is connected so that the selection transistor is caused to be in a conductive state. Accordingly, oxygen ions $O^{2-}$ are attracted to the switch area 102 of the selected memory cell MC, so that an oxidation reaction occurs in the switch area 102 of the filament 101. As a result, it is considered that the resistance state of the variable resistive element forming layer 44 transfers to a high-resistance state due to the increase of the resistivity of the switch area 102.

Furthermore, in a read operation for reading the state of the memory cell MC, a read voltage Vread is applied to a selected global bit line GBL corresponding to the local bit line LBL to which the memory cell MC is connected and for example, 0 V is applied to the other unselected global bit lines GBL. Moreover, for example, 0 V is applied to a selected word line WL to which the selected memory cell MC is connected, and a voltage Vread/2, which is a half of the read voltage Vread, is applied to the other unselected word lines WL. Further, a current is selectively applied to a selection transistor STr to which the local bit line LBL is connected, and the other selection transistors are maintained in a non-conductive state. Accordingly, the read voltage Vread is applied to only the selected memory cell MC, so that the read operation is performed.

When the resistance changing operation is performed in the switch area 102 and a positive voltage with respect to the conductive layers 42a to 42d (WL) is applied to the conductive layer 43 as described above, oxygen ions move toward the conductive layer 43. For this reason, the barrier metal film 432 is provided on the side of the conductive layer 43 on which the switch area 102 is formed. Accordingly, even when an oxidation reaction occurs in the switch area 102, the diffusion of oxygen ions is prevented by the barrier metal film 432. That is, in this embodiment, the barrier metal film 432 is provided on the side where the bit line BL (conductive layer 43) has a positive polarity at the time of reset when the variable resistive element forming layer 44 is caused to perform a bipolar type operation.

In the first embodiment, the bit line includes the metal plug 431 and the barrier metal films 432 in a nonvolatile memory device having a three-dimensional structure in which nR-1Tr type strings are disposed above the substrate in the form of a matrix and in the nR-1Tr type strings, the plurality of word lines is disposed in a height direction through the variable resistive element forming layers 44 on the side surfaces of the bit lines disposed perpendicular to the substrate and including the selection transistors at the end portions thereof close to the substrate. Accordingly, it is possible to improve the adhesion between the metal plug 431 and the variable resistive element forming layers 44 and to reduce the resistance value of the bit line. Further, the formation temperature of the bit line can be made lower than that of a bit line made of polysilicon. For this reason, the profile of the variable resistive element forming layer 44, which has been adjusted to have a desired oxygen profile or a desired oxygen-deficiency profile, does not collapse when the bit lines are formed. Accordingly, since it is possible to accurately control the oxygen profile or the oxygen-deficiency profile of the variable resistive element forming layer 44, the memory cell can stably operate.

Furthermore, the barrier metal film 432 is made of a material that contains a metal element having a standard electrode potential higher than the standard electrode potential of the metal forming the variable resistive element forming layer 44, and the switch area 102 in which the resistance changing operation is performed is formed on the side close to the barrier metal film 432. Accordingly, oxygen ions become attracted to the switch area 102 during the reset operation for making the resistance of the switch area 102 high. In this case, since the standard electrode potential of the metal forming the barrier metal film 432 is higher than the standard electrode potential of the metal forming the variable resistive element forming layer 44, the barrier metal film 432 is not easily oxidized. For this reason, even though the nonvolatile memory device continues to be used, an effect of allowing the nonvolatile memory device to stably operate without an increase in the resistance of the bit line is also obtained. Further, a working electrode of a nonvolatile memory also functions as a barrier layer, so that the structure of the nonvolatile memory can be simplified.

Second Embodiment

While a case in which the variable resistive element forming layer includes one variable resistive layer has been described in the first embodiment, a case in which a variable resistive element forming layer includes two variable resistive layers will be described in a second embodiment.

Figure 8:
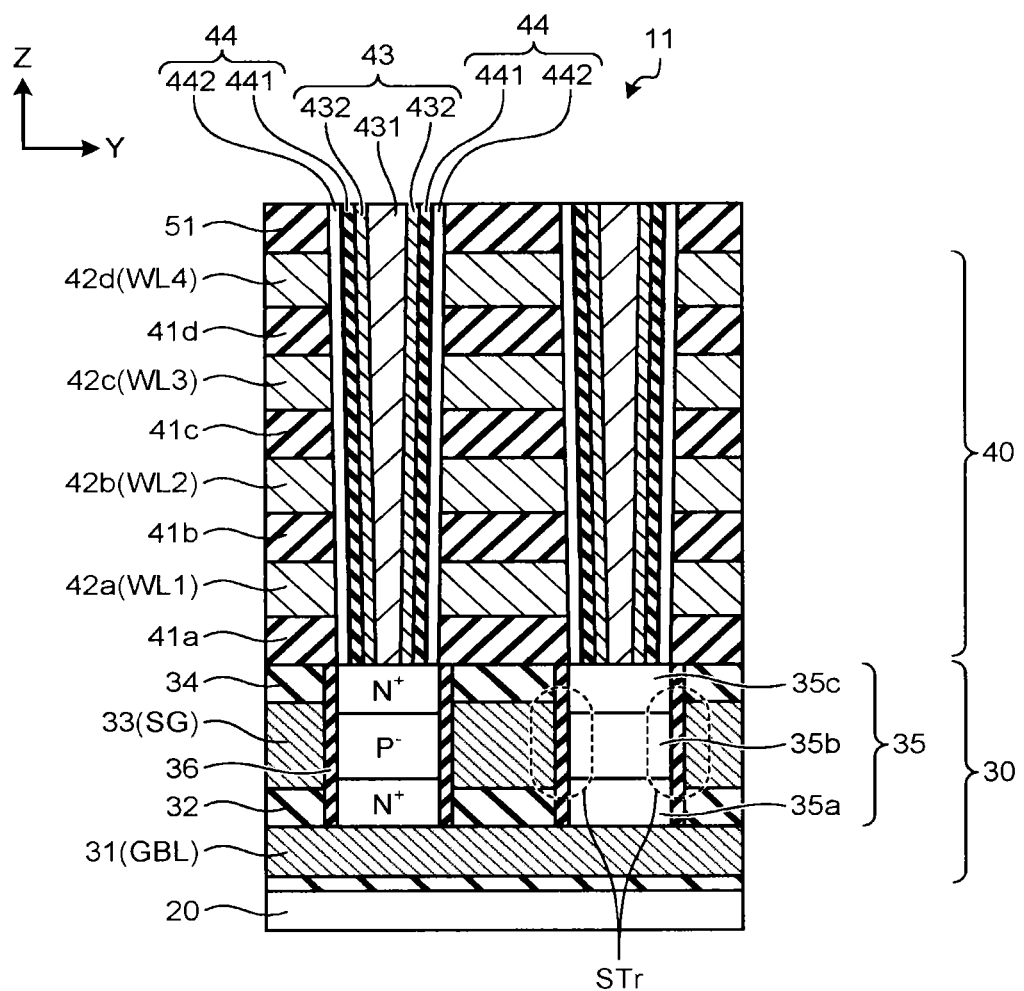
FIG. 8 is a view illustrating an example of a structure of a memory cell array according to a second embodiment.

FIG. 8 is a view illustrating an example of a structure of a memory cell array according to a second embodiment, and is an example of the cross-sectional view taken along line A-A of FIG. 3. A memory cell array 11 has the same structure as the structure of the memory cell array of the first embodiment illustrated in FIGS. 3 and 4. However, in the second embodiment, a variable resistive element forming layer 44 includes a bilayer structure. The bilayer structure includes a first variable resistive layer 441 that is disposed close to a conductive layer 43 functioning as a local bit line and has a low degree of oxygen deficiency and high resistivity, and a second variable resistive layer 442 that is disposed close to conductive layers 42a to 42d functioning as word lines WL and has a high degree of oxygen deficiency and low resistivity.

The first variable resistive layer 441 includes an insulating film. For example, a metal oxide such as a silicon oxide and an aluminum oxide, a metal nitride such as a silicon nitride and an aluminum nitride, or the like is used as the first variable resistive layer 441. Meanwhile, it is preferable that the film thickness of the first variable resistive layer 441 be 3 nm or less. It is possible to reduce distances between the local bit line (conductive layer 43) and the conductive layers 42a to 42d, which function as the word lines WL, by setting the film thickness of the first variable resistive layer 441 to 3 nm or less. As a result, it is possible to reduce a possibility that a filament be formed up to the adjacent word lines WL, and to reliably form a filament in each word line WL.

The second variable resistive layer 442 is made of a metal oxide having the resistivity lower than the resistivity of the first variable resistive layer 441. A metal oxide containing at least one element of, for example, Al, Ti, Hf, Zr, Nb, and Ta is used as the second variable resistive layer 442. The oxygen composition of these metal oxides is less as compared to a stoichiometric ratio of the metal oxide material.

When a voltage having a first polarity and an absolute value larger than the absolute value of a first threshold voltage having the first polarity is applied to the variable resistive element forming layer 44, the resistance state of the variable resistive element forming layer 44 is switched to a low-resistance state. When a voltage having a second polarity and an absolute value larger than the absolute value of a second threshold voltage having the second polarity opposite to the first polarity is applied to the variable resistive element forming layer 44 in this state, the resistance state of the variable resistive element forming layer 44 is switched to a high-resistance state. Further, when a voltage between the first and second threshold voltages is applied, the low-resistance state or the high-resistance state is maintained without the change of a resistance value. As described above, the variable resistive element forming layer 44 is made of a material that performs a bipolar type operation. Meanwhile, in the second embodiment, a filament is generated between the conductive layers 42a to 42d, which function as the word lines WL, and the conductive layer 43, which functions as the local bit line, by forming operation and a switch area in which a resistance changing operation (switch operation) is performed is formed near an interface (first variable resistive layer 441) of the filament, which is close to the local bit line (conductive layer 43).

Furthermore, it is preferable that a band gap of the first variable resistive layer 441 be larger than a band gap of the second variable resistive layer 442. The reason for this is that the filament (switch area) is easily formed because a voltage is applied to the first variable resistive layer 441 when a positive voltage with respect to the bit line (conductive layer 43) is applied to the word lines WL (conductive layers 42a to 42d).

In the second embodiment, the materials of a barrier metal film 432 and the first variable resistive layer 441 are selected so that a standard electrode potential of a metal forming the barrier metal film 432 is higher than a standard electrode potential of a metal forming the first variable resistive layer 441.

Meanwhile, the same components as the components of the first embodiment are denoted by the same reference numerals and the description thereof will be omitted. Further, since the operation of the nonvolatile memory device according to the second embodiment is also the same as that according to the first embodiment, the description thereof will be omitted.

The same effects as the effects of the first embodiment are also obtained in the second embodiment. Furthermore, in the second embodiment, the variable resistive element forming layer 44 includes a bilayer structure in a nonvolatile memory device having a three-dimensional structure in which nR-1Tr type strings are disposed above the substrate in the form of a matrix and in the nR-1Tr type strings, the plurality of word lines is disposed in a height direction through the variable resistive element forming layers 44 on the side surfaces of the bit lines disposed perpendicular to the substrate and including selection transistors at the end portions thereof close to the substrate. The bilayer structure includes the first variable resistive layer 441 that is disposed close to the bit line and includes an insulating film, and the second variable resistive layer 442 that is disposed close to the word lines and has resistance lower than the resistance of the first variable resistive layer 441. Accordingly, it is possible to obtain such effects that a switch area can be reliably formed in the first variable resistive layer 441 even when a space is small, and that the storage capacity can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
    a plurality of first wirings that is disposed in first and second directions crossing each other and extends in a third direction perpendicular to the first and second directions;
    a plurality of second wirings that extends in the second direction and is provided at a predetermined interval in the third direction of the first wirings; and memory cells that are disposed at positions where the first and second wirings cross each other, so as to be interposed between the first and second wirings, wherein the memory cell includes a variable resistive layer of which a resistance state changes according to an electrical signal to be applied, the first wiring includes a metal plug layer and a barrier metal film that is provided between the metal plug layer and the variable resistive layer, and a standard electrode potential of a metal that forms the barrier metal film is higher than a standard electrode potential of a metal that forms the variable resistive layer.

2. The nonvolatile memory device according to claim 1, wherein the barrier metal film is made of at least one material selected from the group consisting of TaN, WN, Co, and Ru.

3. The nonvolatile memory device according to claim 1, wherein the metal plug layer is made of W or Cu.

4. The nonvolatile memory device according to claim 1, wherein the variable resistive layer is made of an oxide of at least one metal selected from the group consisting of Al, Ti, Hf, Zr, Nb, and Ta.

5. The nonvolatile memory device according to claim 1, wherein the metal plug layer is made of W, and
the barrier metal film is made of WN.

6. The nonvolatile memory device according to claim 1, wherein the metal plug layer is made of Cu, and
the barrier metal film is made of Ru.

7. The nonvolatile memory device according to claim 1, further comprising:
a controller,
wherein the controller allows a positive reset voltage with respect to the second wiring to be applied to the first wiring during a reset operation switching a resistance state from a low-resistance state to a high-resistance state.

8. The nonvolatile memory device according to claim 7, wherein the variable resistive layer includes a filament where a switch area in which a resistance changing operation is performed is formed close to the first wiring.

9. The nonvolatile memory device according to claim 1, wherein the variable resistive layer includes a first layer that is disposed close to the first wiring and a second layer that is disposed close to the second wiring and has a resistivity lower than a resistivity of the first layer.

10. The nonvolatile memory device according to claim 9, wherein the standard electrode potential of the metal that forms the barrier metal film is higher than a standard electrode potential of a metal that forms the first layer.

11. The nonvolatile memory device according to claim 9, wherein a band gap of the second layer is smaller than a band gap of the first layer.

12. The nonvolatile memory device according to claim 9, wherein a degree of oxygen deficiency of the second layer is higher than a degree of oxygen deficiency of the first layer.

13. The nonvolatile memory device according to claim 11, wherein the first layer has a film thickness of 3 nm or less.

14. The nonvolatile memory device according to claim 1, wherein the barrier metal film has a film thickness of 2 nm or more and 7 nm or less.

15. The nonvolatile memory device according to claim 1, further comprising:
selection transistors each having one end provided at end portions of the first wirings; and
third wirings that are connected to the other ends of the selection transistors and extend in the first direction.

* * * * *